United States Patent
Hou et al.

(10) Patent No.: US 12,229,489 B2
(45) Date of Patent: *Feb. 18, 2025

(54) SYSTEM AND METHOD OF VERIFYING SLANTED LAYOUT COMPONENTS

(71) Applicant: Taiwan Semiconductor Manufacturing Company, Ltd., Hsinchu (TW)

(72) Inventors: Yuan-Te Hou, Hsinchu (TW); Min-Yuan Tsai, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/516,499

(22) Filed: Nov. 21, 2023

(65) Prior Publication Data

US 2024/0086613 A1 Mar. 14, 2024

Related U.S. Application Data

(62) Division of application No. 17/396,519, filed on Aug. 6, 2021, now Pat. No. 11,861,288.

(51) Int. Cl.
*G06F 30/39* (2020.01)
*G06F 30/31* (2020.01)
*G06F 30/392* (2020.01)
*G06F 30/398* (2020.01)

(52) U.S. Cl.
CPC .......... *G06F 30/398* (2020.01); *G06F 30/31* (2020.01); *G06F 30/392* (2020.01)

(58) Field of Classification Search
CPC ...... G06F 30/39; G06F 30/394; G06F 30/398; G06F 30/31; G06F 30/392; G06F 30/33
USPC .......................................................... 716/110
See application file for complete search history.

(56) References Cited

U.S. PATENT DOCUMENTS

| | | | |
|---|---|---|---|
| 7,571,408 B1 * | 8/2009 | Ylinen | G06F 30/394 |
| | | | 257/659 |
| 2005/0005252 A1 | 1/2005 | Kodama et al. | |
| 2015/0178441 A1 | 6/2015 | Chiu et al. | |
| 2018/0165401 A1 * | 6/2018 | Brown | G06F 30/394 |
| 2022/0189874 A1 * | 6/2022 | Manthena | H01L 23/528 |

OTHER PUBLICATIONS

Notice of Allowance on U.S. Appl. No. 17/396,519 dtd Sep. 7, 2023.

* cited by examiner

*Primary Examiner* — Paul Dinh
(74) *Attorney, Agent, or Firm* — FOLEY & LARDNER LLP (57) ABSTRACT

Disclosed herein are related to performing layout verification of a layout design of an integrated circuit having a slanted layout component. In one aspect, a slanted layout component having a side slanted from a base axis by an offset angle is detected. In one aspect, a first location of a vertex of the slanted layout component according to the offset angle is transformed to obtain a second location of a rotated vertex of a rotated layout component. In one aspect, layout verification is performed on the rotated layout component with respect to the base axis.

20 Claims, 9 Drawing Sheets

Design Layer (drawing pattern)

FIG. 6A

Process View

SYSTEM AND METHOD OF VERIFYING SLANTED LAYOUT COMPONENTS

CROSS-REFERENCE TO RELATED APPLICATION

This application is a divisional of U.S. patent application Ser. No. 17/396,519, filed Aug. 6, 2021, titled "SYSTEM AND METHOD OF VERIFYING SLANTED LAYOUT COMPONENTS." The entire disclosure of U.S. Utility application Ser. No. 17/396,519 is incorporated herein by reference for all purposes.

BACKGROUND

The recent trend in miniaturizing integrated circuits (ICs) has resulted in smaller devices which consume less power yet provide more functionality at higher speeds than before. In one aspect, the miniaturization in the ICs is achieved by advancement in fabrication processes. For example, over millions or billions of circuit components (e.g., transistors) can be formed in a small area (e.g., less than 100 mm$^2$). To ensure that components of an IC can be fabricated as designed through complex fabrication processes, various electronic design automation (EDA) tools are utilized.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a system, device, and method for performing layout verification on slanted layout components are disclosed. In one aspect, a slanted layout component is a layout component having a side slanted from a base axis. A layout component may indicate a size and a location of a polygon corresponding to a structure (e.g., structure for forming a transistor, metal rail, via contact, etc.) for forming an integrated circuit. In one aspect, an offset angle of the side of the slanted layout component with respect to the base axis is determined. In one aspect, the slanted layout component is rotated according to the offset angle to obtain a rotated layout component having a side in parallel with the base axis. In one aspect, layout verification can be performed on the rotated layout component with respect to the base axis.

Advantageously, the disclosed system, device, and method enable layout verification on slanted layout components based on the base axis. Example layout verification includes design rule check (DRC) verification to verify a spacing between two layout components, verify a pitch between two layout components, verify width or length of a side of a layout component, etc. In one aspect, layout verification is performed by measuring a distance or spacing between two layout components along a direction in parallel with the base axis. By determining the offset angle and rotating the slanted layout components according to the offset angle, the rotated layout components may have sides in parallel with or perpendicular to the base axis. Hence, layout verification can be performed on the rotated layout components by measuring a distance or spacing between sides of rotated layout components. By allowing verification on slanted layout components, layout components can be placed and routed within a smaller area and with increased flexibility.

Figure 1:
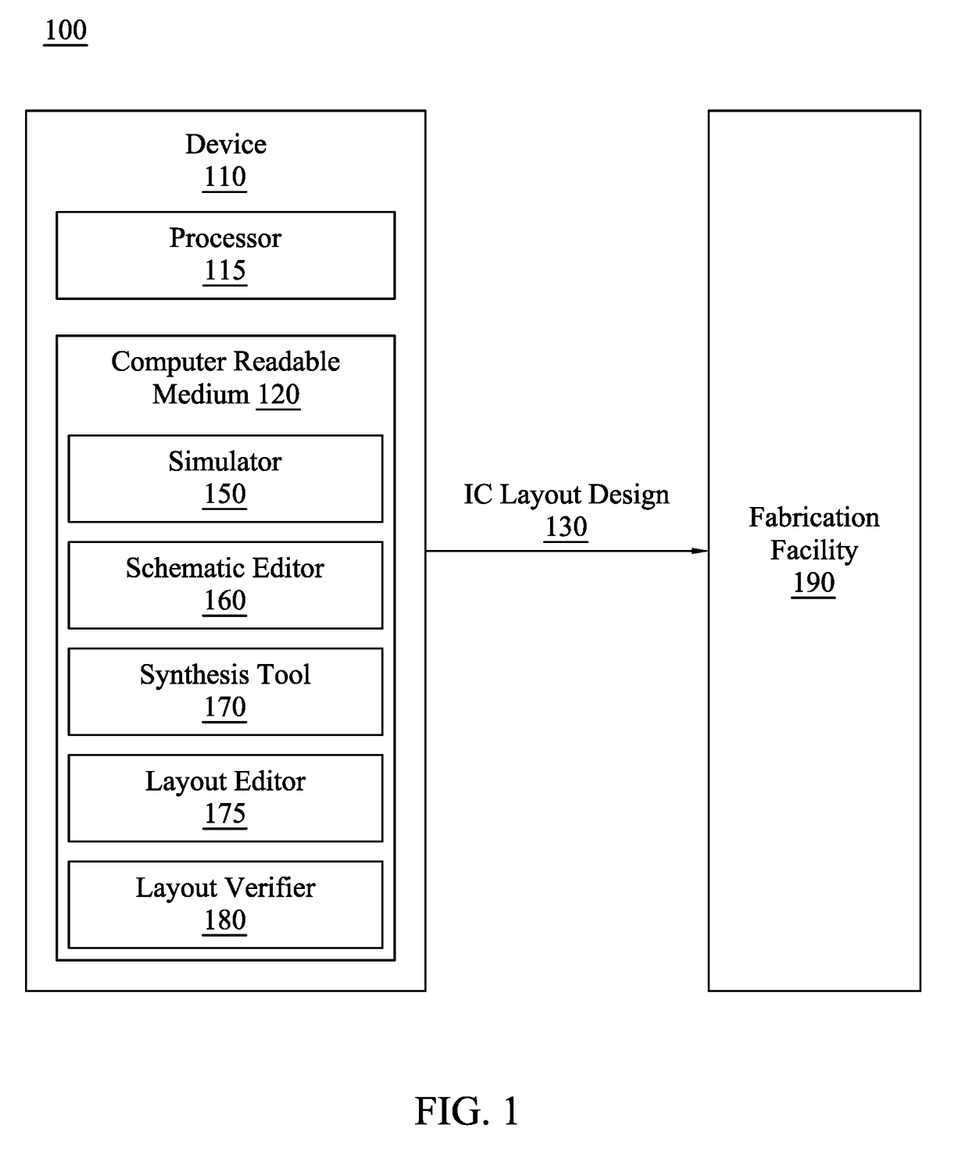
FIG. 1 is a diagram of a system for generating an integrated circuit, in accordance with one embodiment.

FIG. 1 is a diagram of a system 100 for generating an integrated circuit, in accordance with one embodiment. In some embodiments, the system 100 includes a device 110 that provides an IC layout design 130 (also referred to as "a layout design 130" herein) to a fabrication facility 190. The device 110 may be a computing device operated by a user (or a circuit designer). The layout design 130 may indicate locations and sizes of a set of polygons corresponding to various structures of IC. The layout design 130 may be in a GDSII format. The fabrication facility 190 may receive the layout design 130 and fabricate multiple ICs according to the layout design 130.

In some embodiments, the device 110 includes one or more processors 115 and a non-transitory computer readable medium 120 storing instructions when executed by the one or more processors 115 cause the one or more processors 115 to perform various processes or operations for generating the layout design 130. In some embodiments, the non-transitory computer readable medium 120 stores software applications including a simulator 150, a schematic editor 160, a synthesis tool 170, a layout editor 175, and a layout verifier 180. These applications may assist a user of the device 110 to generate the layout design 130. In some embodiments, the non-transitory computer readable medium 120 stores more, fewer, or different applications than shown in FIG. 1.

In some embodiments, the schematic editor 160 is a software application enabling a user to generate a gate level design of circuit components. The gate level design may indicate schematic relationships of circuit components. For example, the schematic editor 160 allows a user to provide, through a graphical user interface, input to create or define schematic connections of circuit components such as transistors, resistors, capacitors, inductors, etc. Based on the user input provided through the graphical user interface, the schematic editor 160 may automatically generate a netlist data indicating the schematic relationships of the circuit components.

In some embodiments, the synthesis tool 170 is a software application that generates a gate level design of circuit components based on register transistor level (RTL) design of an integrated circuit. For example, the synthesis tool 170 receives a text or a code (e.g., Verilog or VHDL) indicating logic level design or RTL design of the integrated circuit, and automatically generates a netlist data indicating schematic relationships of circuit components to perform logic operations or functions as indicated by the RTL design.

In some embodiments, the simulator 150 is a software application to simulate or predict a performance a circuit design. The simulator 150 may simulate the performance of the circuit design in response to various conditions applied. The simulator 150 may perform simulation on a gate level design, a logic level design, or a combination of them. Based on the simulation result, the user of the device 110 may adjust or modify the gate level design or the logic level design.

In some embodiments, the layout editor 175 is a software application for generating a layout design. In one aspect, the layout editor 175 provides a graphical user interface that allows a user to draw or define locations and sizes of polygons corresponding to various layout components. In one aspect, the layout editor 175 can automatically generate a layout design based on the logic level design or the gate level design. The layout editor 175 may generate the layout design in a GDSII format.

In some embodiments, the layout verifier 180 is a software application to confirm or verify the layout design from the layout editor 175. Example layout verification includes DRC verification to verify a spacing between two layout components, verify a pitch between two layout components, verify width or length of a side of a layout component, etc. Additional layout verifications include layout versus schematic (LVS) verification, electrical rule check (ERC) verification, etc. For example, LVS verification can be performed to confirm whether connections of layout components are consistent with the schematic connections indicated by the netlist data.

Figure 2:
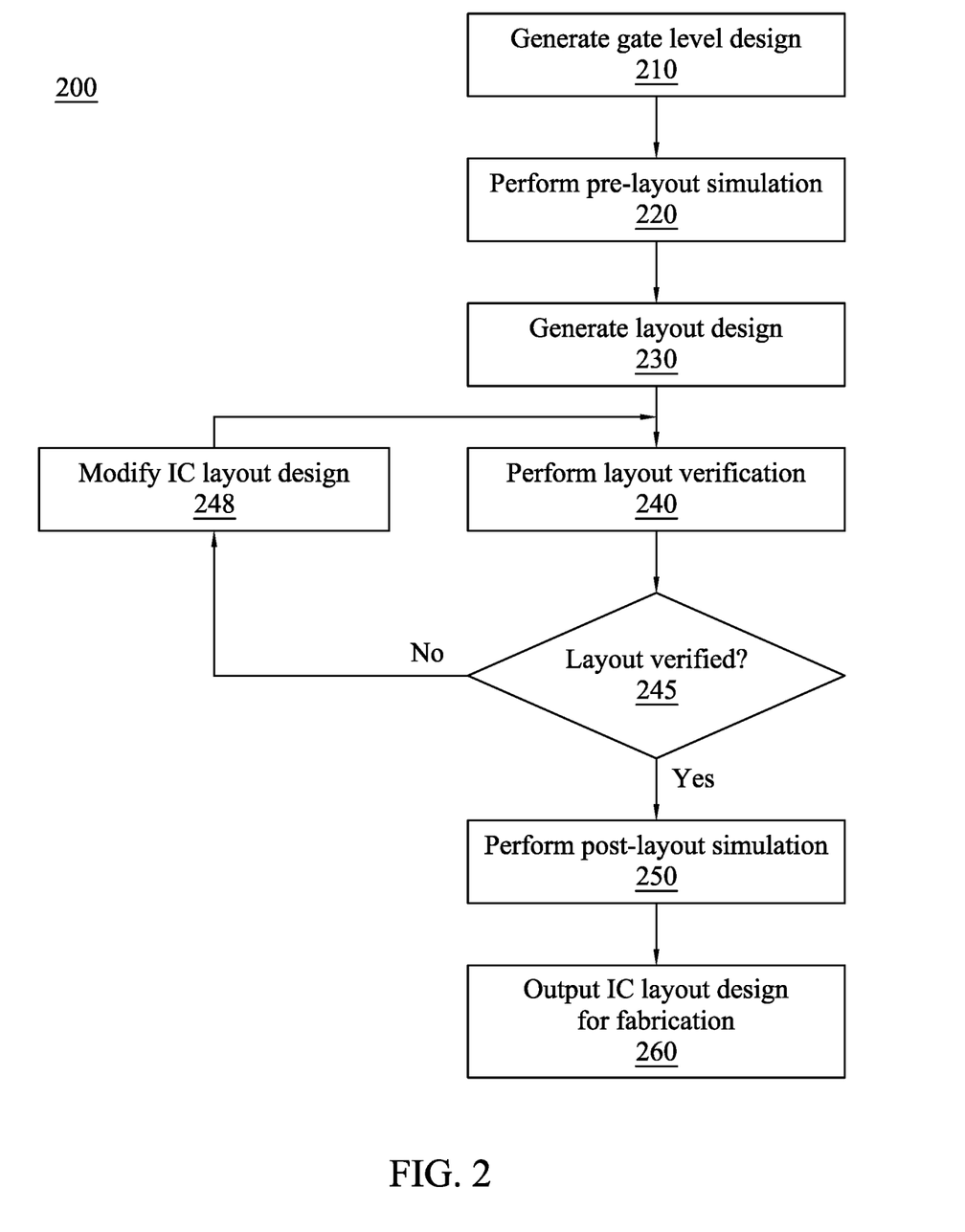
FIG. 2 is a flowchart showing a method of generating a layout design, in accordance with some embodiments.

FIG. 2 is a flowchart showing a method 200 of generating a layout design, in accordance with some embodiments. The method 200 may be performed by the device 110 of FIG. 1. In some embodiments, the method 200 is performed by other entities. In some embodiments, the method 200 includes more, fewer, or different operations than shown in FIG. 2.

In an operation 210, the device 110 generates the gate level design. In one approach, a user can provide, through the schematic editor 160, input to create or define schematic connections of circuit components such as transistors, resistors, capacitors, inductors, etc. Based on the user input, the schematic editor 160 may automatically generate a netlist data indicating the schematic relationships of the circuit components. In one approach, the synthesis tool 170 receives a text or a code (e.g., Verilog or VHDL) indicating logic level design or RTL design of the integrated circuit, and automatically generates a netlist data indicating schematic relationships of circuit components to perform logic operations or functions as indicated by the RTL design.

In an operation 220, the device 110 performs a pre-layout simulation. In one approach, the simulator 150 may simulate or predict the performance of the circuit design in response to various conditions applied. The simulator 150 may perform simulation on a gate level design, a logic level design, or a combination of them. Based on the simulation result, the user may adjust or modify the gate level design or the logic level design.

In an operation 230, the device 110 generates a layout design 130. In one approach, the user can draw or define, through the layout editor 175, locations and sizes of polygons corresponding to various layout components. In one approach, the layout editor 175 can automatically generate a layout design 130 based on the logic level design or the gate level design. The layout editor 175 may generate the layout design 130 in a GDSII format.

In an operation 240, the device 110 performs layout verification on the layout design 130. In one approach, the layout verifier 180 can check or verify a spacing between two layout components, verify a pitch between two layout components, verify width or length of a side of a layout component, etc. Additional layout verifications include LVS verification, ERC verification, etc. For example, LVS verification can be performed to confirm whether connections of layout components are consistent with the schematic connections indicated by the netlist data. In an operation 245, the device 110 determines whether the layout is verified or not and generates a report indicating the verification result. For example, the report may indicate one or more layout components violating spacing rules, and/or indicate one or more layout components satisfying the spacing rules. If the layout design 130 does not pass any of DRC, LVS, ERC verifications, the layout design 130 can be modified based on the report through the layout editor 175 in an operation 248 and additional layout verification can be performed until the layout design 130 passes DRC, LVS, ERC verifications.

If the layout design 130 passes DRC, LVS, ERC verifications, the device 110 can proceed to an operation 250 and perform a post-layout simulation. For example, the simulator 150 may simulate the performance of the circuit design with parasitic capacitances or resistances extracted based on the layout design 130. Based on the post-layout simulation result, the logic level design, the gate level design, the layout design 130, or any combination of them can be modified. If the post-layout simulation satisfies target performances, the device 110 can output the layout design 130 to the fabrication facility 190 for fabrication.

Figure 3:
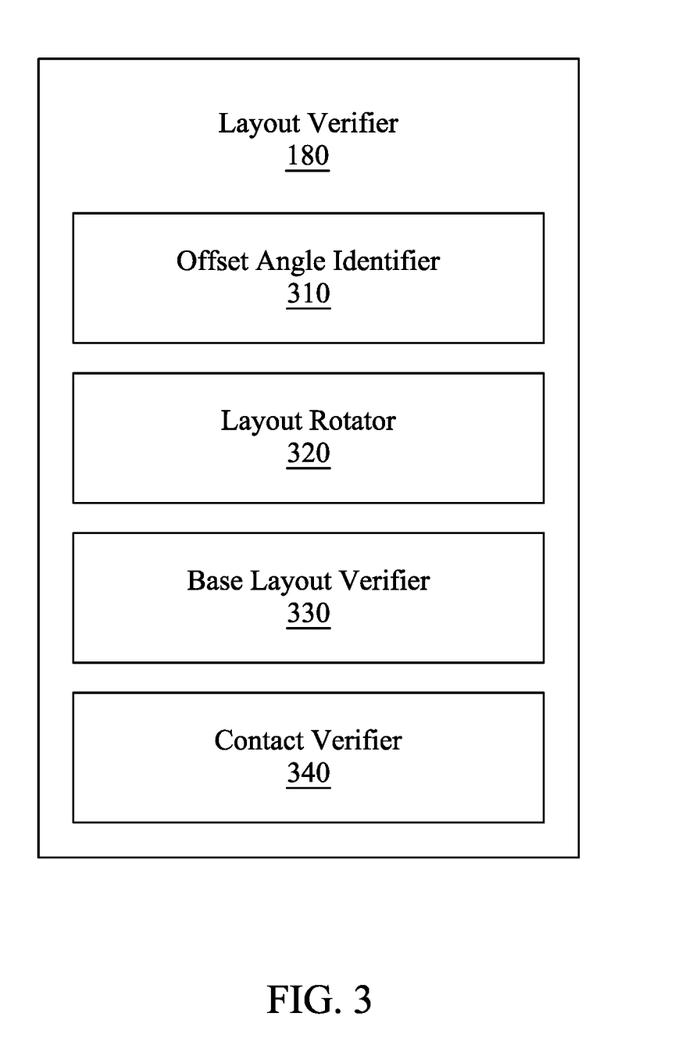
FIG. 3 is a diagram of a layout verifier, in accordance with some embodiments.

FIG. 3 is a diagram of the layout verifier 180, in accordance with some embodiments. In some embodiments, the layout verifier 180 includes an offset angle identifier 310, a layout rotator 320, a base layout verifier 330, and a contact verifier 340. These components may operate together to perform layout verification on slanted layout components. In some embodiments, the layout verifier 180 includes more, fewer, or different components than shown in FIG. 3.

In some embodiments, the offset angle identifier 310 is a component that detects an offset angle of one or more layout components with respect to a base axis. A set of layout components may have parallel sides elongated along a direction traversing a direction of a base axis at an offset angle. The offset angle may be a non-perpendicular angle between 0 and 90 degrees. The offset angle identifier 310 may detect, from a plurality of layout components, the set of layout components extending along a parallel direction slanted from the base axis by the offset angle and determine the offset angle for the set of layout components. The offset angle identifier 310 may also detect, from the plurality of layout components, a different set of layout components extending along another parallel direction slanted from the base axis at another offset angle, and determine the another offset angle for the different set of layout components.

In some embodiments, the layout rotator 320 is a component that automatically rotates slanted layout components to obtain rotated layout components. In one aspect, the layout rotator 320 automatically rotates the slanted layout components such that sides of rotated layout components can be in parallel with or perpendicular to the base axis. The layout rotator 320 may identify, for a layout component, locations of a set of vertexes, and transform a location for each vertex to a new location according to the offset angle. Assuming for an example that a vertex is located at (X, Y), the layout rotator 320 may obtain a new location (X', Y') according to the following equation:

$$X'=X \cos \theta + Y \sin \theta, \quad Y'=-X \sin \theta + Y \cos \theta \qquad \text{Eq. (1)}$$

where $\theta$ is the offset angle. For example, if a layout component has vertexes (X1, Y1), (X2, Y2), (X3, Y3), (X4, Y4), the layout rotator 320 may generate new vertexes (X1', Y1'), (X2', Y2'), (X3', Y3'), (X4', Y4') based on the Eq. (1) according to the offset angle.

In some embodiments, the base layout verifier 330 is a component that performs layout verification on the layout design. Example layout verification includes DRC verification to verify a spacing between two layout components, verify a pitch between two layout components, verify width or length of a side of a layout component, etc. In one aspect, the layout verification is performed with respect to two base axes (e.g., X-axis and Y-axis) in a Cartesian coordination system. In one aspect, layout verification is performed by measuring a distance or spacing between two layout components along a direction in parallel with or perpendicular to a base axis. By rotating slanted layout components by the layout rotator 320 to obtain rotated layout components in parallel with or perpendicular to a base axis, the base layout verifier 330 may perform layout verification on rotated layout components.

In some embodiments, the contact verifier 340 is a component that verifies a layout component for a via contact coupled to a slanted layout component. In one aspect, the contact verifier 340 verifies the layout component for the via contact based on a point location of the layout component, rather than a rectangular area allocated for the via contact. In general, a rectangular area may indicate or specify a location and a size of a via contact between two overlapping layout components. However, an overlapping area between the slanted layout component and another layout component may not be sufficient to encompass a rectangular area for the via contact. In one aspect, the contact verifier 340 may verify whether a slanted layout component has sufficient enclosure to cover the layout component for the via contact. For example, the contact verifier 340 verifies whether a distance between i) a side of the slanted layout component, and ii) a point location, at which the layout component for the via contact is located, exceeds a threshold value. The contact verifier 340 may also verify whether enough spacing is provided between two nearby layout components for via contacts coupled to the slanted layout component. For example, the contact verifier 340 verifies whether a distance between i) a first point location, at which a first layout component for a first via contact is located, and ii) a second point location, at which a second layout component for a second via contact is located, exceeds a threshold value. Accordingly, the contact verifier 340 may verify whether via contacts can be securely formed for slanted layout components.

Figure 4:
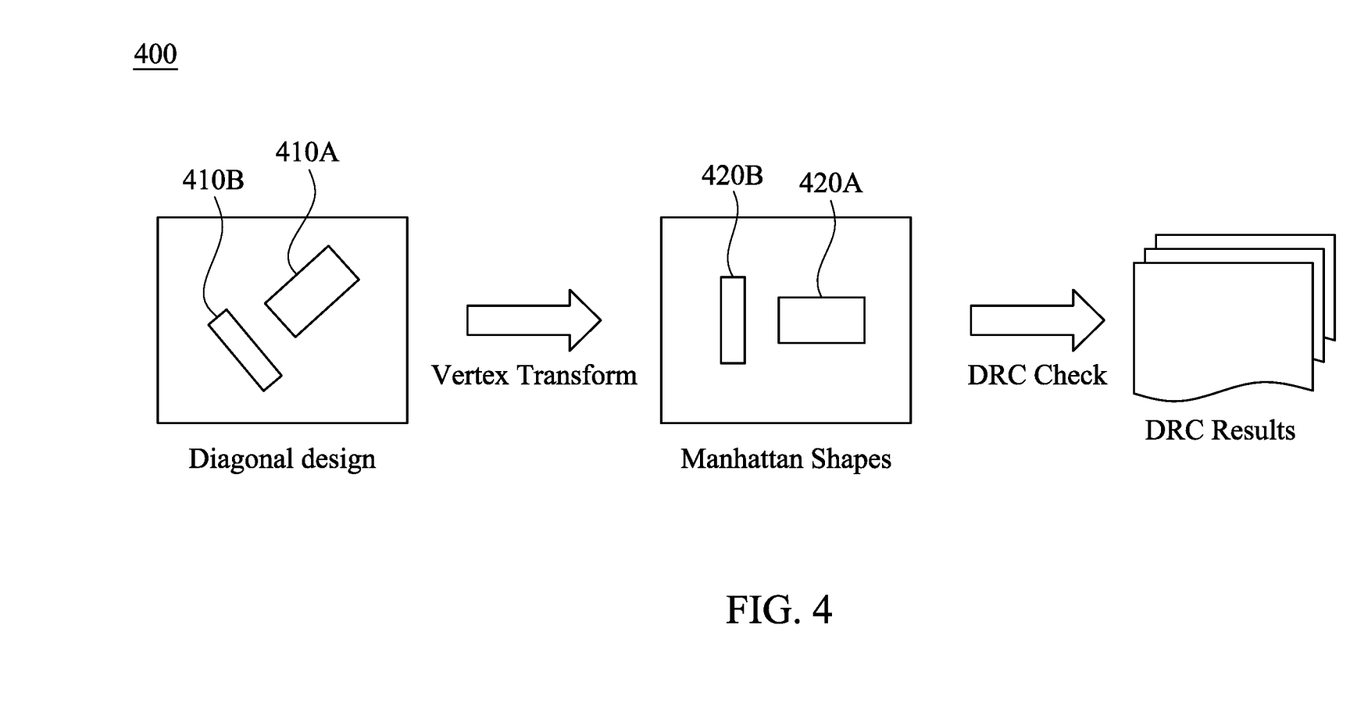
FIG. 4 is a diagram showing a process of performing a layout verification on slanted layout components, in accordance with some embodiments.

FIG. 4 is a diagram showing a process 400 of performing a layout verification on slanted layout components 410A, 410B, in accordance with some embodiments. The slanted layout components 410A, 410B may indicate sizes and locations of structures for forming a transistor, metal rail, via contact, etc. In one approach, the offset angle identifier 310 detects the slanted layout components 410A, 410B having sides slanted from a base axis in a Cartesian coordination system. The offset angle identifier 310 may detect an offset angle between i) an elongated direction of sides of the slanted layout components 410A, 410B, and ii) a direction of the base axis. The layout rotator 320 may rotate the slanted layout components 410A, 410B according to offset angle to obtain rotated layout components 420A, 420B. For example, the layout rotator 320 applies, for each vertex of the slanted layout components, a location of the vertex to the equation Eq. (1) utilizing the offset angle to obtain a location of a transformed vertex. In one aspect, the rotated layout components 420A, 420B have sides in parallel with the base axis. The base layout verifier 330 may perform layout verification (e.g., DRC verification) on the rotated layout components 420A, 420B.

Figure 5:
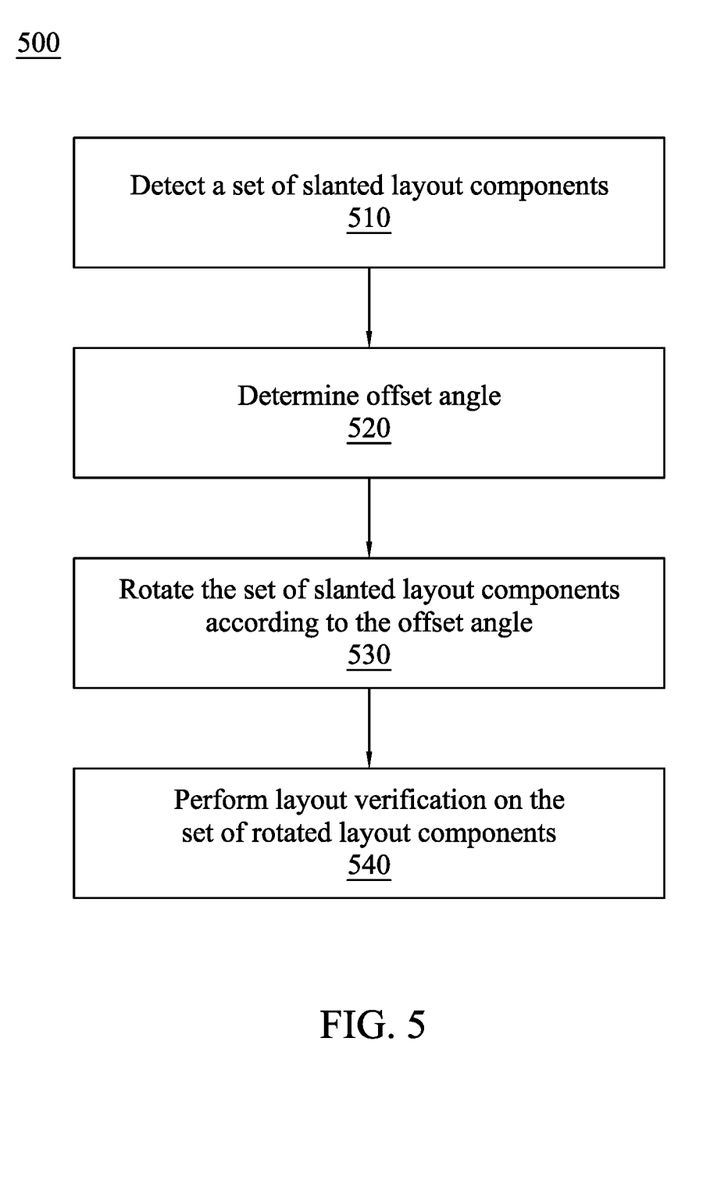
FIG. 5 is a flowchart showing a method of rotating a slanted layout component and performing a layout verification on the rotated layout component, in accordance with some embodiments.

FIG. 5 is a flowchart showing a method 500 of rotating a slanted layout component and performing a layout verification on the rotated layout component, in accordance with some embodiments. The method 500 may be performed by the device 110 of FIG. 1. In some embodiments, the method 500 is performed by other entities. In some embodiments, the method 500 includes more, fewer, or different operations than shown in FIG. 5.

In an operation 510, the device 110 detects a set of slanted layout components. The device 110 may detect, from a plurality of layout components, the set of slanted layout components extending along a parallel direction slanted from the base axis by the offset angle. The device 110 may also detect, from the plurality of layout components, a different set of slanted layout components extending along another parallel direction slanted from the base axis at another offset angle.

In an operation 520, the device 110 determines an offset angle of the set of layout components with respect to the base axis. The device 110 may compare an elongated direction of parallel sides of the set of slanted layout components with the base axis and determine the offset angle according to the comparison. The device 110 may determine the offset angle of the set of slanted layout components, and determine the another offset angle of the different set of slanted layout components.

In an operation 530, the device 110 rotates the set of layout components according to the offset angle to obtain a set of rotated layout components. For example, the device 110 applies, for each vertex of the slanted layout components, a location of the vertex to the equation Eq. (1) according to the offset angle to obtain a location of a transformed vertex. The transformed vertexes may be vertexes of the set of rotated layout components. The device 110 may rotate the different set layout components according to the another offset angle to obtain another set of rotated layout components.

In an operation 540, the device 110 performs layout verification on the set of rotated layout components with respect to the base axis. For example, the device 110 may perform DRC verification on the set of rotated layout component. The device 110 may verify a spacing between two rotated layout components, verify a pitch between two rotated layout components, verify width or length of a side of the rotated layout component, etc.

Figure 6A:
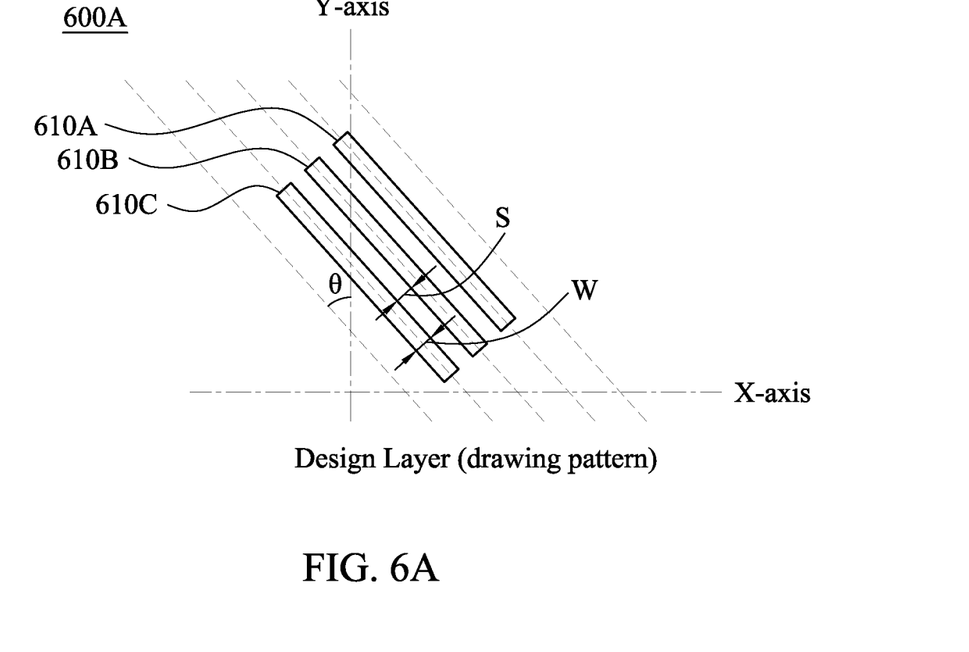
FIG. 6A is a diagram showing a layout design of an integrated circuit having a set of slanted layout components, in accordance with some embodiments.
Figure 6B:
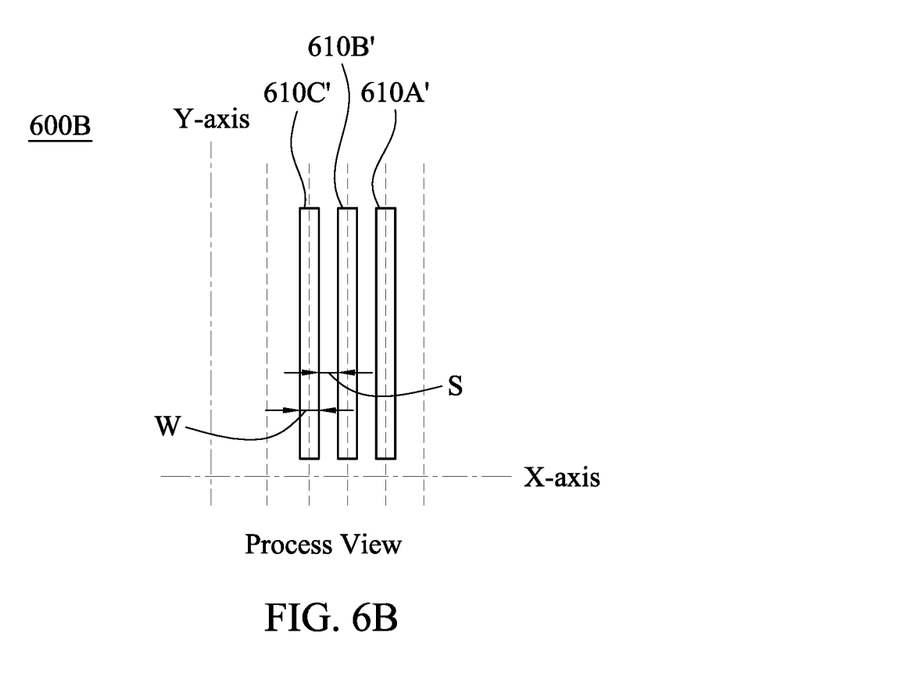
FIG. 6B is a diagram showing a rotated layout design obtained by rotating the set of slanted layout components in FIG. 6A, in accordance with some embodiments.

FIG. 6A is a diagram showing a layout design 600A of an integrated circuit having a set of slanted layout components 610A, 610B, 610C, in accordance with some embodiments. FIG. 6B is a diagram showing a rotated layout design 600B including rotated layout components 610A', 610B', 610C' obtained by rotating the set of slanted layout components 610A, 610B, 610C in FIG. 6A, in accordance with some embodiments.

The slanted layout components 610A-610C may indicate sizes and locations of structures for forming a transistor, metal rail, via contact, etc. In one approach, the offset angle identifier 310 detects the slanted layout components 610A-610C having sides slanted from the Y-axis in a Cartesian coordination system. The offset angle identifier 310 may detect an offset angle θ between the slanted layout components 610A-610C, and the Y-axis. For example, the offset angle identifier 310 may compare an elongated direction of sides of the layout components 610A-610C with the direction of the Y-axis to determine the offset angle θ. The layout rotator 320 may rotate the slanted layout components 610A-610C according offset angle θ to obtain rotated layout components 610A'-610C'. In one aspect, the rotated layout components 610A'-610C' are in parallel with the Y-axis. The base layout verifier 330 may perform layout verification (e.g., DRC verification) on the rotated layout components 610A'-610C' with respect to the X-axis, the Y-axis or both. For example, the base layout verifier 330 may verify a width W of each of the rotated layout components 610A'-610C' along the X-direction or a spacing S between two rotated layout components 610A', 610B' along the X-direction.

Figure 7A:
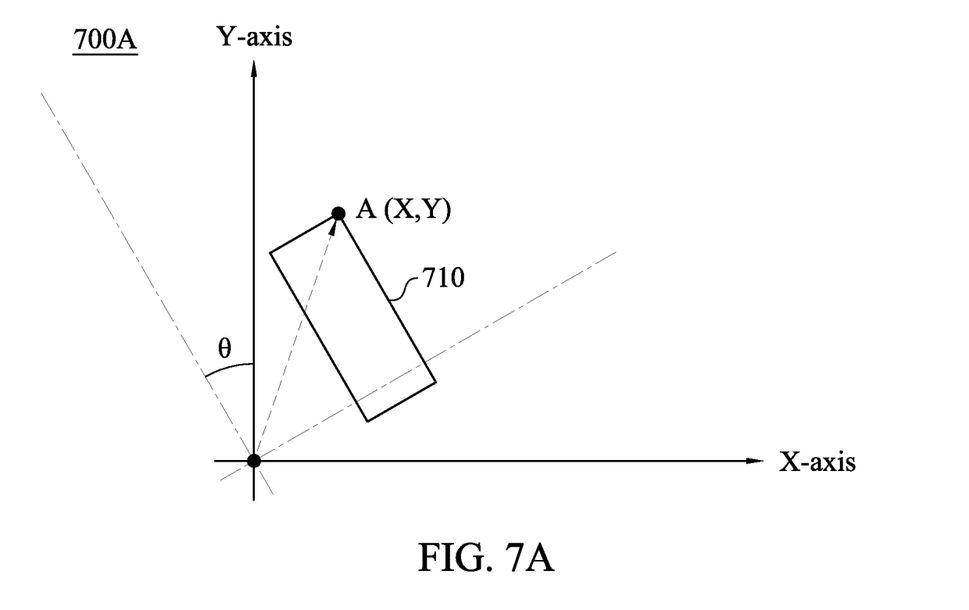
FIG. 7A is a diagram showing a layout design of a slanted layout component, in accordance with some embodiments.
Figure 7B:
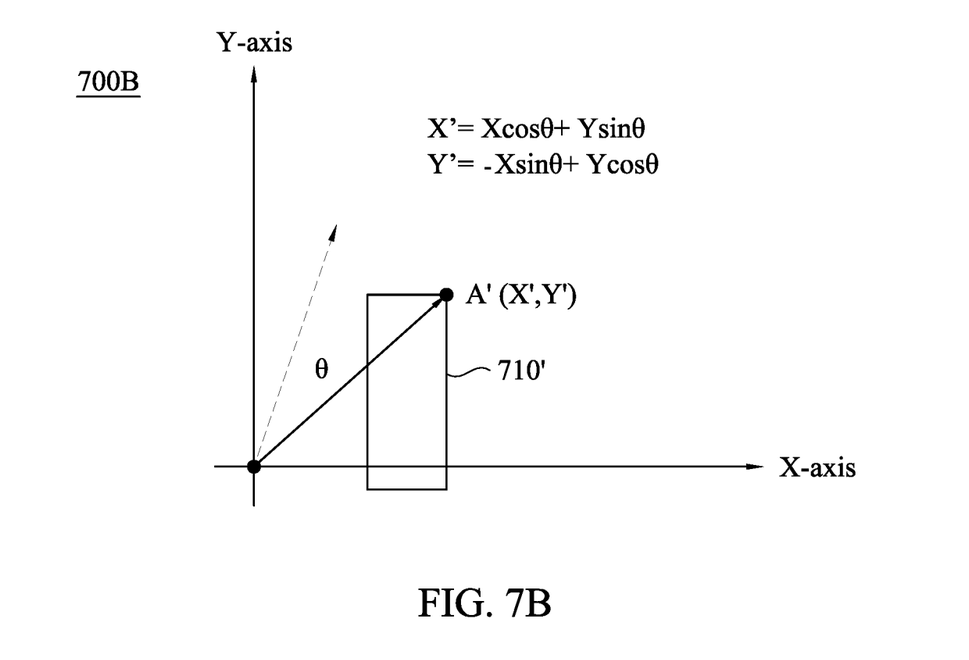
FIG. 7B is a diagram showing a rotated layout design obtained by rotating the slanted layout component in FIG. 7A, in accordance with some embodiments.

FIG. 7A is a diagram showing a layout design 700A of a slanted layout component 710, in accordance with some embodiments. FIG. 7B is a diagram showing a rotated layout design 700B obtained by rotating the slanted layout component 710 in FIG. 7A, in accordance with some embodiments.

In one approach, the offset angle identifier 310 may determine the offset angle θ of the slanted layout component 710. For example, the offset angle identifier 310 may compare a difference in an elongated direction of a side of the slanted layout component 710 and a direction of the Y-axis to determine the offset angle θ. The layout rotator 320 may apply, for each vertex of the slanted layout components, a location of the vertex to the equation Eq. (1), according to the offset angle θ to obtain a location of a transformed vertex. For example, for the vertex A of the slanted layout component 710, the layout rotator 320 may apply a location (X, Y) of the vertex A to the equation Eq. (1) to obtain a location (X',Y') of a transformed vertex A'. The layout rotator 320 may transform the remaining vertexes of the slanted layout components 710 to obtain transformed vertexes of the rotated layout component 710'. The rotated layout component 710' may have sides in parallel with or perpendicular to the Y-axis.

Figure 8A:
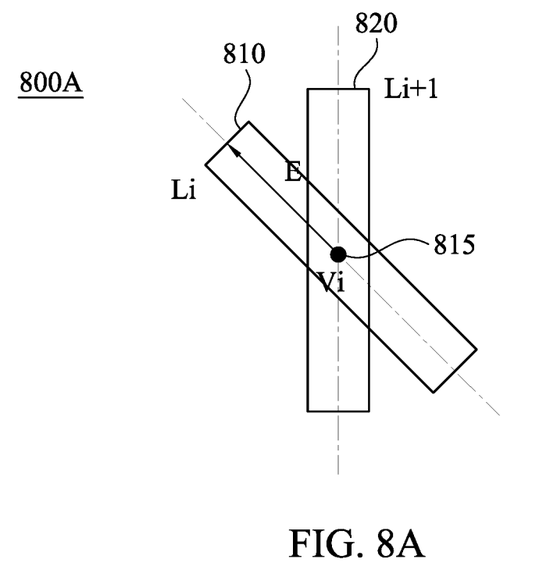
FIG. 8A is a diagram showing two layout components overlapping in a non-perpendicular angle, in accordance with some embodiments.

FIG. 8A is a diagram showing a layout design 800A of two layout components 810, 820 overlapping in a non-perpendicular angle, in accordance with some embodiments. The layout components 810, 820 may overlap with each other in a non-perpendicular angle. The layout component 810 may correspond to a metal rail in a first layer $L_i$, and the layout component 820 may correspond to a metal rail in a second layer $L_{i+1}$. For example, the layout component 810 is a slanted layout component slanted with respect to a base axis. In one aspect, the contact verifier 340 verifies a layout component for a via contact coupled to the slanted layout component 810. In one aspect, the contact verifier 340 verifies the layout component for the via contact based on a point location 815, at which the layout components 810, 820 overlap. In one aspect, the contact verifier 340 may verify whether the slanted layout component 810 has sufficient enclosure to cover the layout component for the via contact at the point location 815. For example, the contact verifier 340 determines a distance E between i) a side of the slanted layout component 810, and ii) the point location 815. The contact verifier 340 may verify whether the distance E exceeds a threshold value to determine whether sufficient enclosure is provided.

Figure 8B:
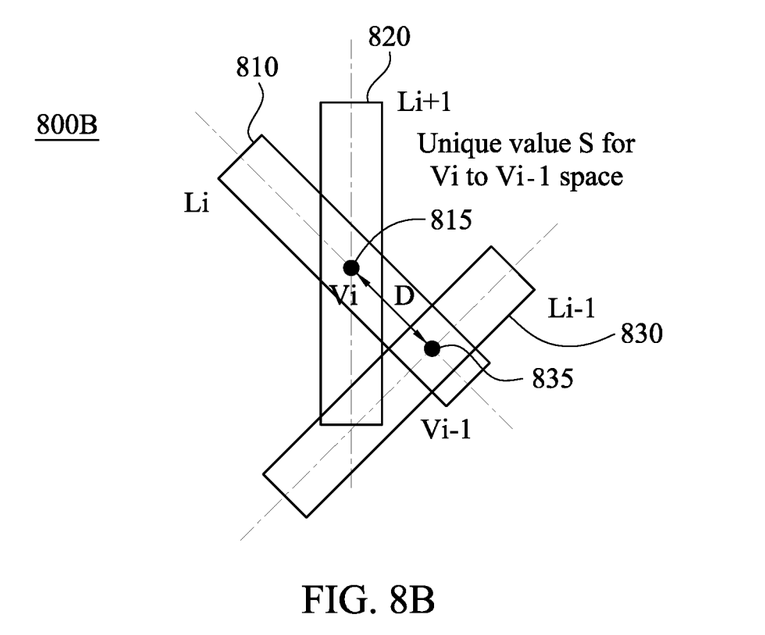
FIG. 8B is a diagram showing three layout components overlapping in a non-perpendicular angle, in accordance with some embodiments.

FIG. 8B is a diagram showing a layout design 800B of three layout components 810, 820, 830 overlapping in a non-perpendicular angle, in accordance with some embodiments. The layout components 810, 820 may overlap with each other in a non-perpendicular angle, and the layout components 810, 830 may overlap with each other in a non-perpendicular angle. The layout components 810, 830 may overlap with each other in a perpendicular angle or a non-perpendicular angle. The layout component 810 may correspond to a metal rail in a first layer $L_i$, the layout component 820 may correspond to a metal rail in a second layer $L_{i+1}$, and the layout component 830 may correspond to a metal rail in a third layer $L_{i+1}$. For example, the layout components 810, 830 may be slanted layout components slanted with respect to a base axis. The contact verifier 340 may also verify whether enough spacing is provided between two nearby layout components for via contacts connected to the slanted layout component 810. For example, the contact verifier 340 determines a distance D between i) the first point location 815, at which a first layout component for a first via contact between the layout components 810, 820 is located, and ii) a second point location 835, at which a second layout component for a second via contact between the layout components 810, 830 is located. The contact verifier 340 may verify whether the distance D exceeds a threshold value to determine whether sufficient spacing is provided between two via contacts at the point locations 815, 835. Accordingly, the contact verifier 340 may verify whether via contacts can be securely formed for slanted layout components.

Figure 9:
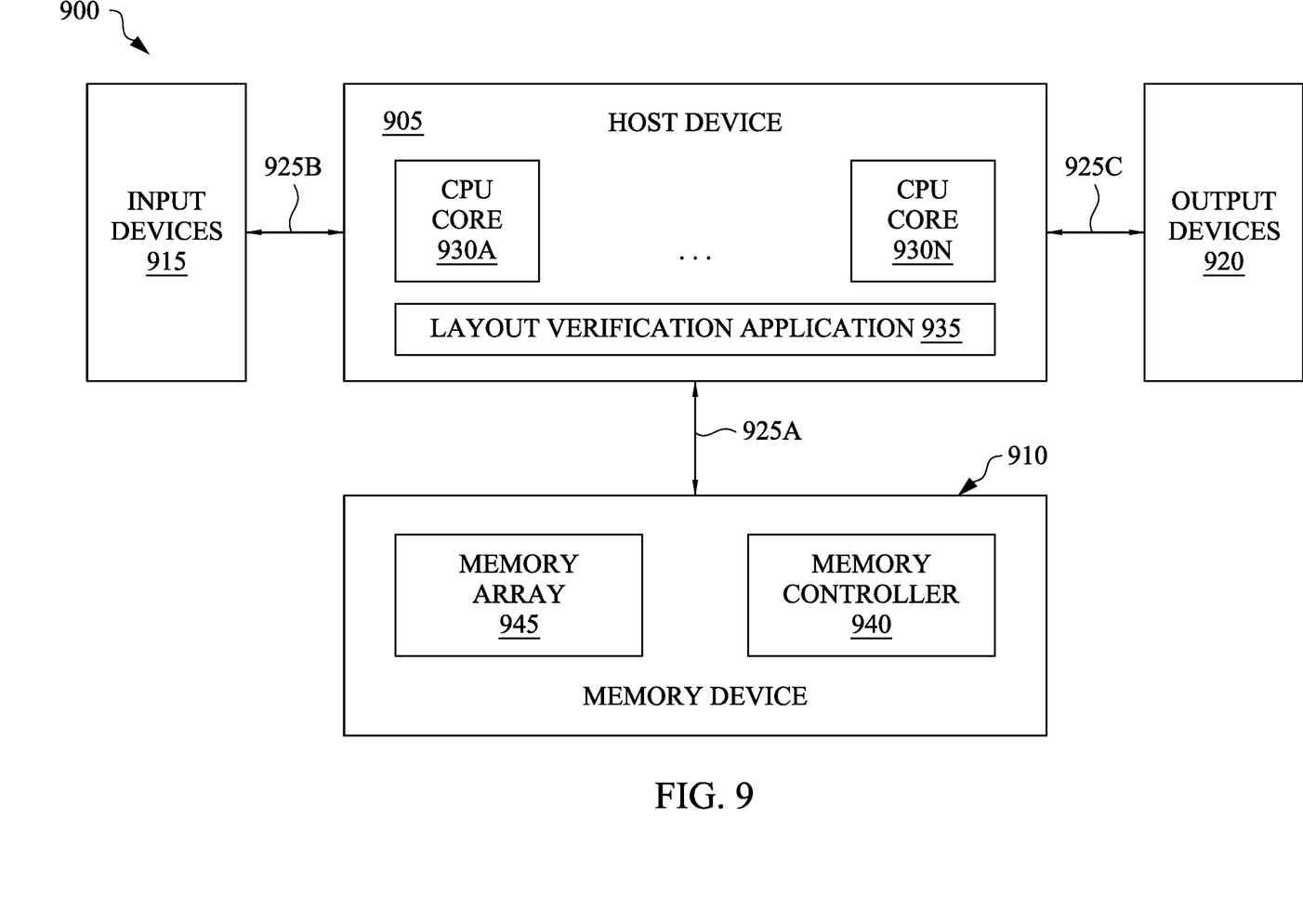
FIG. 9 is an example block diagram of a computing system, in accordance with some embodiments.

Referring now to FIG. 9, an example block diagram of a computing system 900 is shown, in accordance with some embodiments of the disclosure. The computing system 900 may be used by a circuit or layout designer for integrated circuit design. A "circuit" as used herein is an interconnection of electrical components such as resistors, transistors, switches, batteries, inductors, or other types of semiconductor devices configured for implementing a desired functionality. The computing system 900 includes a host device 905 associated with a memory device 910. The host device 905 may be configured to receive input from one or more input devices 915 and provide output to one or more output devices 920. The host device 905 may be configured to communicate with the memory device 910, the input devices 915, and the output devices 920 via appropriate interfaces 925A, 925B, and 925C, respectively. The computing system 900 may be implemented in a variety of computing devices such as computers (e.g., desktop, laptop, servers, data centers, etc.), tablets, personal digital assistants, mobile devices, other handheld or portable devices, or any other computing unit suitable for performing schematic design and/or layout design using the host device 905.

The input devices 915 may include any of a variety of input technologies such as a keyboard, stylus, touch screen, mouse, track ball, keypad, microphone, voice recognition, motion recognition, remote controllers, input ports, one or more buttons, dials, joysticks, and any other input peripheral that is associated with the host device 905 and that allows an external source, such as a user (e.g., a circuit or layout designer), to enter information (e.g., data) into the host device and send instructions to the host device. Similarly, the output devices 920 may include a variety of output technologies such as external memories, printers, speakers, displays, microphones, light emitting diodes, headphones, video devices, and any other output peripherals that are configured to receive information (e.g., data) from the host device 905. The "data" that is either input into the host device 905 and/or output from the host device may include any of a variety of textual data, circuit data, signal data, semiconductor device data, graphical data, combinations thereof, or other types of analog and/or digital data that is suitable for processing using the computing system 900.

The host device 905 includes or is associated with one or more processing units/processors, such as Central Processing Unit ("CPU") cores 930A-930N. The CPU cores 930A-930N may be implemented as an Application Specific Integrated Circuit ("ASIC"), Field Programmable Gate Array ("FPGA"), or any other type of processing unit. Each of the CPU cores 930A-930N may be configured to execute instructions for running one or more applications of the host device 905. In some embodiments, the instructions and data to run the one or more applications may be stored within the memory device 910. The host device 905 may also be configured to store the results of running the one or more applications within the memory device 910. Thus, the host device 905 may be configured to request the memory device 910 to perform a variety of operations. For example, the host device 905 may request the memory device 910 to read data, write data, update or delete data, and/or perform management or other operations. One such application that the host device 905 may be configured to run may be a layout verification application 935. The layout verification application 935 may be part of a computer aided design or electronic design automation software suite that may be used by a user of the host device 905 to verify a layout design including slanted layout components. In some embodiments, the instructions to execute or run the layout verification application 935 may be stored within the memory device 910. The layout verification application 935 may be executed by one or more of the CPU cores 930A-930N using instructions from the memory device 910. After the layout design of the integrated circuit is verified, multiples of the integrated circuit can be fabricated according to the layout design by a fabrication facility.

Referring still to FIG. 9, the memory device 910 includes a memory controller 940 that is configured to read data from or write data to a memory array 945. The memory array 945 may include a variety of volatile and/or non-volatile memories. For example, in some embodiments, the memory array 945 may include NAND flash memory cores. In other embodiments, the memory array 945 may include NOR flash memory cores, Static Random Access Memory (SRAM) cores, Dynamic Random Access Memory (DRAM) cores, Magnetoresistive Random Access Memory (MRAM) cores, Phase Change Memory (PCM) cores, Resistive Random Access Memory (ReRAM) cores, 3D XPoint memory cores, ferroelectric random-access memory (FeRAM) cores, and other types of memory cores that are suitable for use within the memory array. The memories within the memory array 945 may be individually and independently controlled by the memory controller 940. In other words, the memory controller 940 may be configured to communicate with each memory within the memory array 945 individually and independently. By communicating with the memory array 945, the memory controller 940 may be configured to read data from or write data to the memory array in response to instructions received from the host device 905. Although shown as being part of the memory device 910, in some embodiments, the memory controller 940 may be part of the host device 905 or part of another component of the computing system 900 and associated with the memory device. The memory controller 940 may be implemented as a logic circuit in either software, hardware, firmware, or combination thereof to perform the functions described herein. For example, in some embodiments, the memory controller 940 may be configured to retrieve the instructions associated with the layout verification application 935 stored in the memory array 945 of the memory device 910 upon receiving a request from the host device 905.

It is to be understood that only some components of the computing system 900 are shown and described in FIG. 9. However, the computing system 900 may include other components such as various batteries and power sources, networking interfaces, routers, switches, external memory systems, controllers, etc. Generally speaking, the computing system 900 may include any of a variety of hardware, software, and/or firmware components that are needed or considered desirable in performing the functions described herein. Similarly, the host device 905, the input devices 915, the output devices 920, and the memory device 910 including the memory controller 940 and the memory array 945 may include other hardware, software, and/or firmware components that are considered necessary or desirable in performing the functions described herein.

One aspect of this description relates to a device for verifying a layout design of an integrated circuit. In some embodiments, the device includes one or more processors, and non-transitory computer readable medium storing instructions. The instructions when executed by the one or more processors may cause the one or more processors to detect a slanted layout component having a side slanted from a base axis. The instructions when executed by the one or more processors may cause the one or more processors to determine an offset angle of the side of the slanted layout component with respect to the base axis. The instructions when executed by the one or more processors may cause the one or more processors to rotate the slanted layout component according to the offset angle to obtain a rotated layout component, wherein the rotated layout component has a rotated side in parallel with the base axis. The instructions when executed by the one or more processors may cause the one or more processors to perform layout verification on the rotated layout component with respect to the base axis.

One aspect of this description relates to a device for verifying a layout design of an integrated circuit. In some embodiments, the device includes one or more processors, and a non-transitory computer readable medium that stores instructions. The instructions when executed by the one or more processors may cause the one or more processors to detect a slanted layout component having a side slanted from a base axis by an offset angle. The instructions when executed by the one or more processors may cause the one or more processors to transform a first location of a vertex of the slanted layout component according to the offset angle to obtain a second location of a rotated vertex of a rotated layout component. The instructions when executed by the one or more processors may cause the one or more processors to perform layout verification on the rotated layout component with respect to the base axis.

One aspect of this description relates to a method of verifying a layout design of an integrated circuit. In some embodiments, the method includes detecting a first layout component in a first layer extending along a first direction. In some embodiments, the method includes detecting a second layout component in a second layer extending along a second direction. In some embodiments, the method includes verifying a third layout component corresponding to a via contact at a point location between the first layout component and the second layout component. The first direction and the second direction may be non-perpendicular with each other.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A non-transitory computer readable medium storing instructions that when executed by one or more processors cause the one or more processors to:
   detect a slanted layout component having a side slanted from a base axis by an offset angle,
   detect a first location of a vertex of the slanted layout component,
   rotate the slanted layout component according to the offset angle to obtain a rotated layout component, wherein the rotated layout component has a rotated side in parallel with the base axis,
   transform the first location of the vertex of the slanted layout component according to the offset angle to obtain a second location of the rotated vertex of the rotated layout component, and
   perform layout verification on the rotated layout component with respect to the base axis.

2. The non-transitory computer readable medium of claim 1, further storing instructions when executed by the one or more processors cause the one or more processors to:
   transform a third location of another vertex of the slanted layout component according to the offset angle to obtain a fourth location of another rotated vertex of the rotated layout component.

3. The non-transitory computer readable medium of claim 1, further storing instructions when executed by the one or more processors cause the one or more processors to:
   verify a layout component corresponding to a via contact at a point location between the slanted layout component in a first layer and another layout component in a second layer.

4. The non-transitory computer readable medium of claim 3, further storing instructions when executed by the one or more processors cause the one or more processors to:
   detect another layout component corresponding to another via contact at another point location between the slanted layout component in the first layer and an additional layout component in a third layer, and
   verify a spacing between i) the via contact at the point location and ii) the another via contact at the another point location.

5. The non-transitory computer readable medium of claim 3, wherein the another layout component has another side slanted from the base axis by another offset angle.

6. The non-transitory computer readable medium of claim 5, further storing instructions when executed by the one or more processors cause the one or more processors to:
   determine the another offset angle of the another side of the another layout component with respect to the base axis, and
   transform a third location of another vertex of the another layout component according to the another offset angle to obtain a fourth location of another rotated vertex of a second rotated layout component.

7. A method comprising:
   detecting, by a device, a first layout component in a first layer extending along a first direction;
   detecting, by the device, a second layout component in a second layer extending along a second direction;
   verifying, by the device, a location of a third layout component corresponding to a via contact at a point location between the first layout component and the second layout component, wherein the first direction and the second direction are non-perpendicular with each other, and wherein another layout component corresponding to another via contact at another point location between the slanted layout component in the first layer and an additional layout component in a third layer is detected, and a spacing between the via contact at the point location and the another via contact at the another point location is verified; and
   generating, by the device, a report indicating a verification result of the location of the third layout component.

8. The method of claim 7, further comprising:
   detecting, by the device, a fourth layout component correspond to another via contact at another point location between the first layout component in the first layer and a fifth layout component in a third layer; and verifying, by the device, a spacing between i) the via contact at the point location and ii) the another via contact at the another point location.

9. The method of claim 7, further comprising:
determining, by the device, an offset angle of a side of the first layout component with respect to a base axis, wherein the offset angle is larger than 0 degrees and less than 90 degrees; and
transforming, by the device, a first location of a vertex of the first layout component according to the offset angle to obtain a second location of a rotated vertex of a rotated layout component.

10. The method of claim 9, further comprising:
transforming, by the device, a third location of another vertex of the first layout component according to the offset angle to obtain a fourth location of another rotated vertex of the rotated layout component.

11. The method of claim 9, further comprising:
determining, by the device, another offset angle of another side of the second layout component with respect to the base axis; and
transforming, by the device, a third location of another vertex of the second layout component according to the another offset angle to obtain a fourth location of another rotated vertex of another rotated layout component.

12. The method of claim 11, further comprising:
performing, by the device, layout verification on the rotated layout component and the another rotated layout component with respect to the base axis.

13. The method of claim 11, wherein the rotated layout component and the another rotated layout component are in parallel with the base axis.

14. A method comprising:
detecting a slanted layout component having a side slanted from a base axis;
determining an offset angle of the side of the slanted layout component with respect to the base axis;
rotating the slanted layout component according to the offset angle to obtain a rotated layout component, wherein the rotated layout component has a rotated side in parallel with the base axis; and
performing layout verification on the rotated layout component with respect to the base axis.

15. The method of claim 14, further comprising:
detecting a first location of a vertex of the slanted layout component; and
transforming the first location of the vertex according to the offset angle to obtain a second location of a rotated vertex of the rotated layout component.

16. The method of claim 15, further comprising:
detecting a third location of another vertex of the slanted layout component; and
transforming the third location of the another vertex according to the offset angle to obtain a fourth location of another rotated vertex of the rotated layout component.

17. The method of claim 14, further comprising:
verifying a layout component corresponding to a via contact at a point location between the slanted layout component in a first layer and another layout component in a second layer.

18. The method of claim 17, further comprising:
detecting the another layout component corresponding to another via contact at another point location between the slanted layout component in the first layer and an additional layout component in a third layer, and
verifying a spacing between the via contact at the point location and the another via contact at the another point location.

19. The method of claim 17, wherein the another layout component has another side slanted from the base axis by another offset angle.

20. The method of claim 19, further comprising:
determining the another offset angle of the another side of the another layout component with respect to the base axis;
rotating the another layout component according to the another offset angle to obtain an additional rotated layout component, wherein the additional rotated layout component has another rotated side in parallel with the base axis; and
performing additional layout verification on the additional rotated layout component with respect to the base axis.

* * * * *